(12) United States Patent
Roth

(10) Patent No.: US 11,432,436 B2
(45) Date of Patent: Aug. 30, 2022

(54) DATA CENTER COOLING SYSTEM AND RELATED METHODS

(71) Applicant: Jason Todd Roth, Orlando, FL (US)

(72) Inventor: Jason Todd Roth, Orlando, FL (US)

( * ) Notice: Subject to any disclaimer, the term of this patent is extended or adjusted under 35 U.S.C. 154(b) by 21 days.

(21) Appl. No.: 16/997,288

(22) Filed: Aug. 19, 2020

(65) Prior Publication Data

US 2021/0059078 A1 Feb. 25, 2021

Related U.S. Application Data

(60) Provisional application No. 62/888,715, filed on Aug. 19, 2019.

(51) Int. Cl.
H05K 7/20 (2006.01)

(52) U.S. Cl.
CPC ..... *H05K 7/20745* (2013.01); *H05K 7/20145* (2013.01)

(58) Field of Classification Search
CPC .......... H05K 7/20745; H05K 7/20145; H05K 7/206; H05K 7/20754; H05K 7/20827; H05K 7/20772; H05K 7/20736; H05K 7/20681; H05K 7/20781; H05K 7/20636; H05K 7/20318; H05K 7/2079; H05K 7/20309; H05K 7/20327; F28F 13/00; F28D 15/00; B01D 53/26; B01D 53/268; B01D 53/28; B01D 2257/80; F24F 1/0076
See application file for complete search history.

(56) References Cited

U.S. PATENT DOCUMENTS

| | | | |
|---|---|---|---|
| 5,250,091 A * | 10/1993 | Nigsch | H01M 8/04156 55/490.2 |
| 5,379,832 A | 1/1995 | Dempsey | |
| 10,306,809 B1 * | 5/2019 | Totani | H05K 7/20754 |
| 2008/0072754 A1 * | 3/2008 | Burban | B01D 65/003 96/8 |
| 2008/0239659 A1 * | 10/2008 | Kundapur | H05K 7/20736 361/679.49 |
| 2013/0182388 A1 | 7/2013 | Wu et al. | |
| 2013/0333414 A1 * | 12/2013 | Inaba | H05K 7/20 62/513 |
| 2014/0374929 A1 * | 12/2014 | Fujita | B01D 53/268 261/129 |
| 2015/0036293 A1 * | 2/2015 | Martini | H05K 7/20381 361/695 |
| 2017/0164525 A1 * | 6/2017 | Chapel | F16L 9/19 |
| 2018/0042140 A1 * | 2/2018 | Pan | H05K 7/20327 |
| 2018/0098464 A1 * | 4/2018 | Ishinabe | H05K 7/20236 |
| 2018/0168074 A9 | 6/2018 | Slessman | |

(Continued)

*Primary Examiner* — Stephen S Sul
*Assistant Examiner* — Alexander Ryan Horton
(74) *Attorney, Agent, or Firm* — Allen, Dyer Et Al.

(57) ABSTRACT

A data center cooling system includes an air handler, a blower coupled to the air handler, and a thermal-polarization pipe coupled to the blower. The blower is configured to supply air through the thermal-polarization pipe. The system also includes at least one pressure box coupled to the thermal-polarization pipe, where the at least one pressure box is configured to house electronics. The thermal-polarization pipe includes an inner tube, an outer tube surrounding the inner tube and forming an annular cavity between the inner and outer tubes, and a thermal-polarization membrane carried by an outer surface of the inner tube.

19 Claims, 3 Drawing Sheets

(56) References Cited

U.S. PATENT DOCUMENTS

| | | |
|---|---|---|
| 2019/0107341 A1 | 4/2019 | Yoshida et al. |
| 2020/0107474 A1* | 4/2020 | Schmidt ............ H05K 7/20745 |
| 2021/0190083 A1* | 6/2021 | Kim ..................... F04D 29/624 |
| 2021/0212237 A1* | 7/2021 | Bean, Jr. ............ H05K 7/20145 |

* cited by examiner

DATA CENTER COOLING SYSTEM AND RELATED METHODS

CROSS-REFERENCE TO RELATED APPLICATIONS

This application claims the benefit of U.S. provisional application No. 62/888,715 filed Aug. 19, 2019, which is hereby incorporated herein in its entirety by reference.

TECHNICAL FIELD

The present invention relates to the field of data centers, and, more particularly, to a data center cooling system and related methods.

BACKGROUND

Computer and electronic equipment for large installations is typically mounted within cabinets. Several cabinets are placed in rows in a designated computer room. The electronic equipment generates a large amount of heat and must remain relatively cool and not overheat otherwise the performance of the computer and electronic equipment is affected.

One way that the equipment is cooled is by mounting the electronic equipment within the cabinets on a raised floor in a common configuration. The ventilation and cooling system pressurizes the space below the electronic cabinets and acts as a large duct with vents through the raised floor in front of the cabinets. A shortcoming of the prior art ventilation system is that a substantial amount of energy is required to cool the space below the cabinets. Accordingly, what is needed in the art is a ventilation and cooling system and method that reduces the amount of energy to cool electronic equipment but at the same time increases the efficiency of cooling the equipment.

SUMMARY

A data center cooling system is disclosed. The system includes an air handler, a blower coupled to the air handler, and a thermal-polarizing pipe coupled to the blower. The blower is configured to supply air through the thermal-polarization pipe. The system also includes at least one pressure box coupled to the thermal-polarization pipe, where the at least one pressure box is configured to house electronics. The thermal-polarizing pipe includes an inner tube, an outer tube surrounding the inner tube and forming an annular cavity between the inner and outer tubes, and a thermal-polarizing membrane carried by an outer surface of the inner tube.

DETAILED DESCRIPTION

Figure 1:
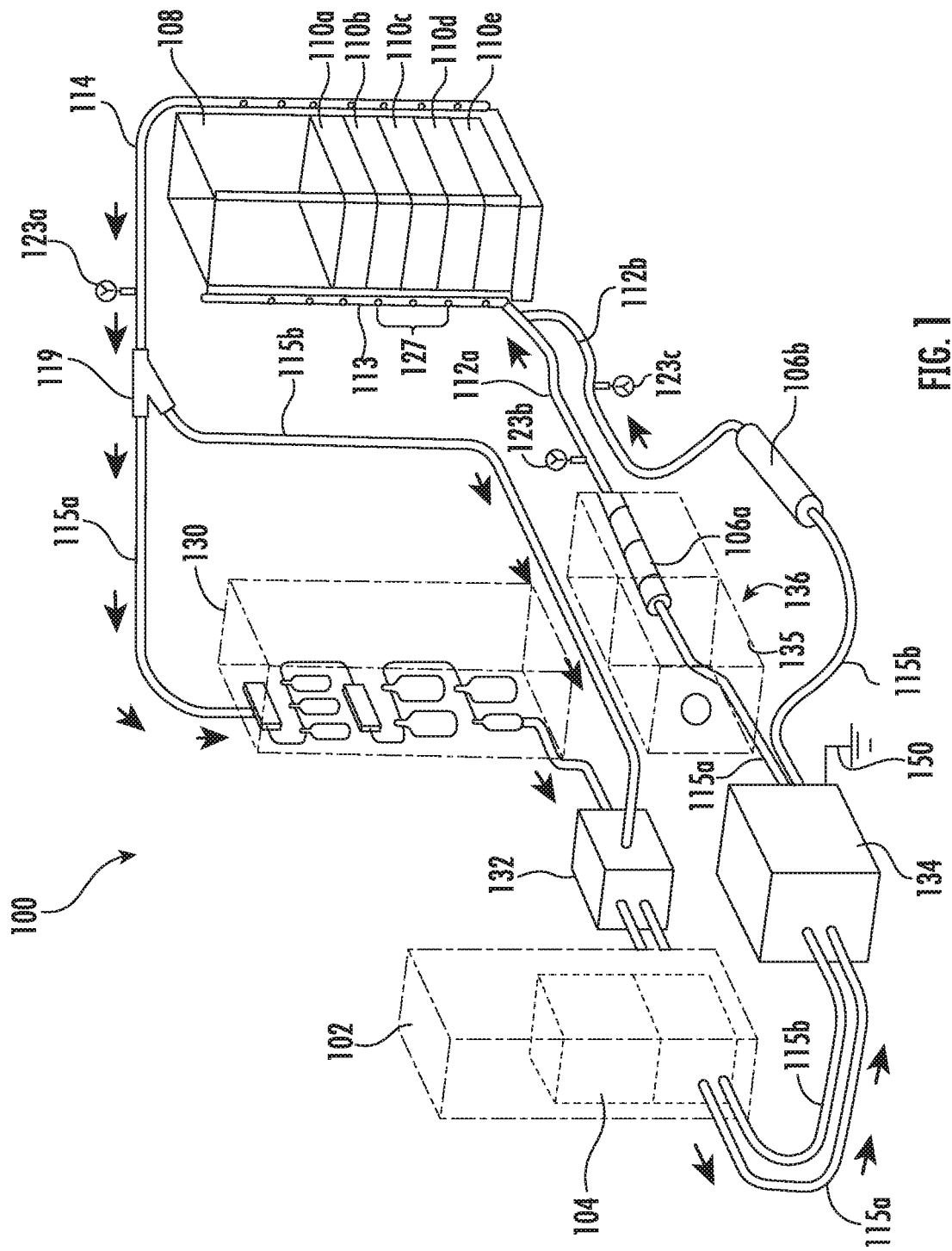
FIG. 1 is a schematic of a data center cooling system in accordance with aspects of the disclosure.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

A data center cooling system is disclosed herein that lowers the cooling energy carbon footprint. This is achieved by creating a circulating equilibrium of air temperature for data center equipment and reducing the need for traditional air conditioning that use coolant chemicals and gasses, high amounts of fresh water and large amounts of energy. Additionally, the system will remove the influence of cross-contamination from microscopic particles and gasses that cause downtime to data center equipment.

The other benefits of the system are control of corrosion and particles leading to reduction on the negative environmental impact data centers traditionally impart (data centers is a broad term used for any computer or technology environment including network rooms, LAN rooms, NOC rooms, etc). Data centers utilizing energy efficient low-conditioned or straight outside air currently have an increased need for microchips and other computer components due to failures resulting from environmental corrosion (see: ASHRAE TC 9.9). Creation of microchips and other computer components puts a strain on the environment as production of these items includes harsh chemicals, fumes and processes negatively impacting the environment. Corrosion is a major problem in the data center industry and this invention can greatly reduce or eliminate the corrosion with control of air content and eliminating the need for humidity to control the static (as all components are grounded), leading to longer lifespan of components and reduction in environmental impact from producing microchips and other components.

Additionally, current data centers utilize infrastructure limited to the blower systems that plume air up high enough to reach servers high, without creating an airstream too-fast which could bypass computers and servers closer to the air supply. Typically this balance limits the height of the stackability of equipment to around seven feet high maximum. This invention solves that issue and allows unlimited upward infrastructure, significantly reducing the footprint of data center building design over land and allowing buildings to take advantage of upward facility infrastructure, such as in downtown sectors or areas where building sprawl is limited.

In particular, the system includes a thermal-polarizing pipe that comprises a thermal-polarizing membrane carried between two tubes, namely, an inner tube and a surrounding outer tube, discussed in further detail below. The thermal-polarizing membrane uses salts and water trapped in between plastic with small polymer formed traps within the membrane to allow a controlled amount of evaporation of the water from one side of the plastic membrane to the other, causing a polarizing thermal effect inside the membrane. Accordingly, the heat generated on one side of the membrane creates a chamber induced trapped condensing reaction making the other side cooler.

The inner and outer tubes are positioned between the thermal-polarizing plastic membrane. The inner and outer tubes are comprised of material allowing high amounts of thermal transfer, however, the material limits off gassing, zinc needles, gaseous and static influence. ESD compliant Carbon fiber is such a material, for example.

The system also includes a pressure-box (which can be mounted to traditional computer cabinets) that houses electronic equipment and is sealed so it can stay pressurized as it connects to an intake pipe and an exhaust pipe that are coupled to the thermal-polarizing pipe to form a closed loop air circulation system. Accordingly, the system continues to move radiating electrons away from the chipset of the equipment housed inside the pressure-box, into the closed loop exhaust pipe. The exhaust heat from the electronics is captured into the exhaust pipe that is coupled to the outer tube of the thermal-polarizing pipe and causes the membrane trapped between the outer tube and the inner tube to polarize, cooling the inner tube surface. Compressed air or a fan of an air handler can continue the closed loop circulation so that the exhaust hot air flows into the cooled inner tube and the cool surface of the inner tube will cool the airflow until it reaches the pressure box to repeat the cycle.

In addition, a traditional air conditioning unit can be installed in the system as a "fail safe" in the case of temperature fluctuation problems. Thus, the air conditioning unit could then be turned on to cool the air in the system to the desired temperature.

The system is configured so that data center equipment can reside in harsh conditions such as on a vessel at sea or one subject to harsh IAQ (Indoor Air Quality).

The system operates at a thermal equilibrium within the closed loop circulation. Since the computer equipment only typically radiates heat inside, moving electrons away from the interior of the electronics is an important action to keep the thermal balance that is desired. Air movement velocity can be raised/lowered to balance the air speed and temperatures on the system, and is just as (or more) important than "cooling". When thermal equilibrium is reached a fraction of the energy will be needed to keep the velocity going as opposed to pushing pressurized conditioned air through entire subfloors (or rooms) as is currently done. Natural cooling from the membrane to attain the correct delta T (change in temperature) to cool the equipment saves energy and allows vertical infrastructure.

Figure 2:
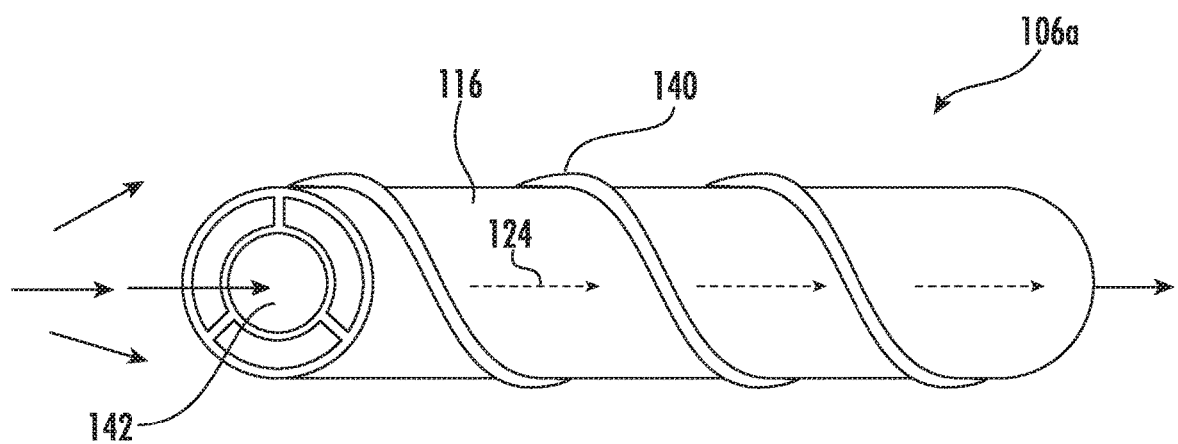
FIG. 2 is a perspective view of a thermal-polarizing pipe of the system of FIG. 1.
Figure 3:
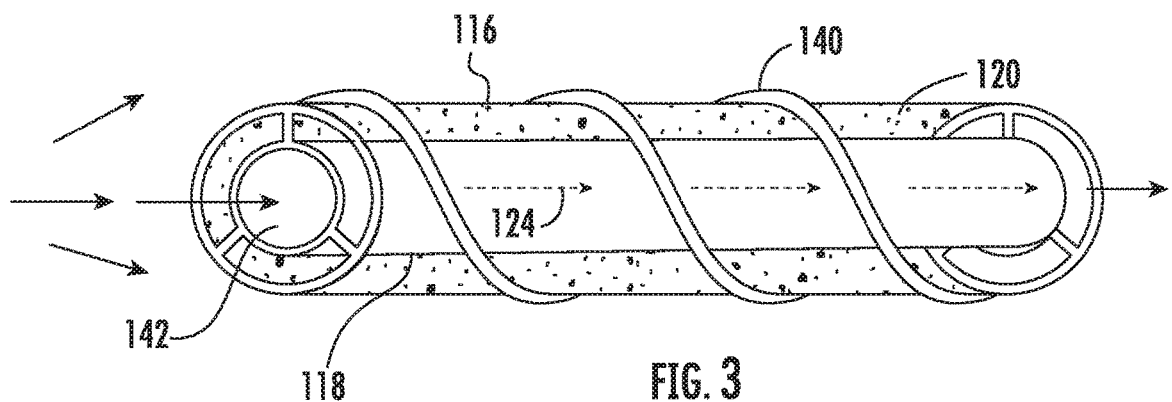
FIG. 3 is a perspective view of the thermal-polarizing pipe of FIG. 2 showing an inner conduit thereof.

Referring now to FIG. 1, a data center cooling system is shown and generally designated 100. The system 100 includes an air handler 102 having a blower 104 coupled to an air ionizer/filter 134 that may also include a grounding wire 150 so that the system is grounded. The blower 104 is configured to force air through the conduits of the system 100 and supply air through at least one thermal-polarizing pipe 106a housed within a chiller box 136. The chiller box 136 includes standard air conditioning equipment 135 as can be appreciated by those of ordinary skill in the art, however, a coil 140 extends from the air conditioning equipment 135 to the thermal-polarizing pipe as shown in FIGS. 2 and 3.

One or more electronics cabinets 108 are coupled to pressure boxes 110a-110e that house various electronics equipment that generate heat that is required to be dissipated in order for the electronics equipment to continue to function properly.

The electronics cabinet 108 may have a respective supply pipe 112a that is coupled to the thermal-polarizing pipe 106a in order to supply cool air to the electronics cabinet 108 and the pressure boxes 110a-110e via manifold 113. An exhaust pipe 114 collects warm exhaust air from the pressure boxes 110a-110e to recirculate back through the thermal-polarizing pipe 106a to cool the air before supplying back to the electronics cabinet 108.

A diverter valve 119 may be downstream of a thermometer and/or hygrometer 123a and be in fluid communication with the exhaust pipe 114. Accordingly, the exhaust air may bypass the nitrogen generator 130 and flow through the system to the chill box 136 via conduit 115b. The nitrogen generator 130 is configured to adjust a mixture of the air flowing through the system. Preferably the concentration of nitrogen is 78-80% or higher in the air to prevent condensation and corrosion. Downstream of the nitrogen generator 130 is a storage box 132 that is used to help equalize the volume of air flowing through the system. Additional thermometers and/or hygrometers 123b, 123c may be in fluid communication with conduit 112a and 112b, respectively, downstream of the chill box 136.

Figure 4:
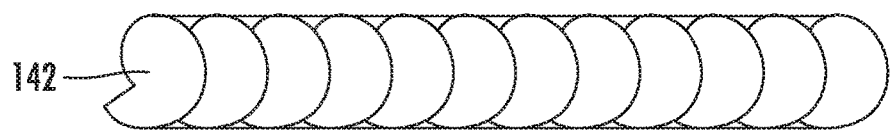
FIG. 4 is a perspective view of a mixer that is configured to fit within the inner conduit.

Referring now to FIGS. 2-4, a perspective view of the thermal-polarizing pipe 106a is shown. The thermal-polarizing pipe 106 include an inner tube 118 and a surrounding outer tube 116. Accordingly, an annular cavity is formed between the outer and inner tubes 116, 118 and a thermal polarizing membrane 120 described in detail above is carried by an outer surface of the inner tube 118. In addition, a temperature controlled coil 140 coupled to the air conditioner 135 may surround the outer tube 116 and have coolant flowing through it to assist the thermal-polarizing membrane to control the temperature of the airflow.

The thermal-polarizing pipe 106b is similar in construction and operation to thermal-polarizing pipe 106a within the chill box 136, but it does not have a temperature controlled coil 140.

The temperature of the chill box 136 is at a much lower temperature than the airflow through the inner tube 118 of the thermal-polarizing pipe 106a. The chill box 136 is configured to directly cool the outer tube 116. The inner tube 118 defines a pathway 124 for airflow through the thermal-polarizing pipe 106a. A mixer 142 is inserted within the inner tube 118 in order to slow the velocity of the airflow through the inner tube 118 of the thermal-polarizing pipe 106a. As a result the heat transfer of the air flow from the inner tube 118 to the outer tube 116 is increased. As can be appreciated by those of ordinary skill in the art, the mixer 142 may include a variety of different sized and shaped baffles, or may have a helical configuration.

Figure 5:
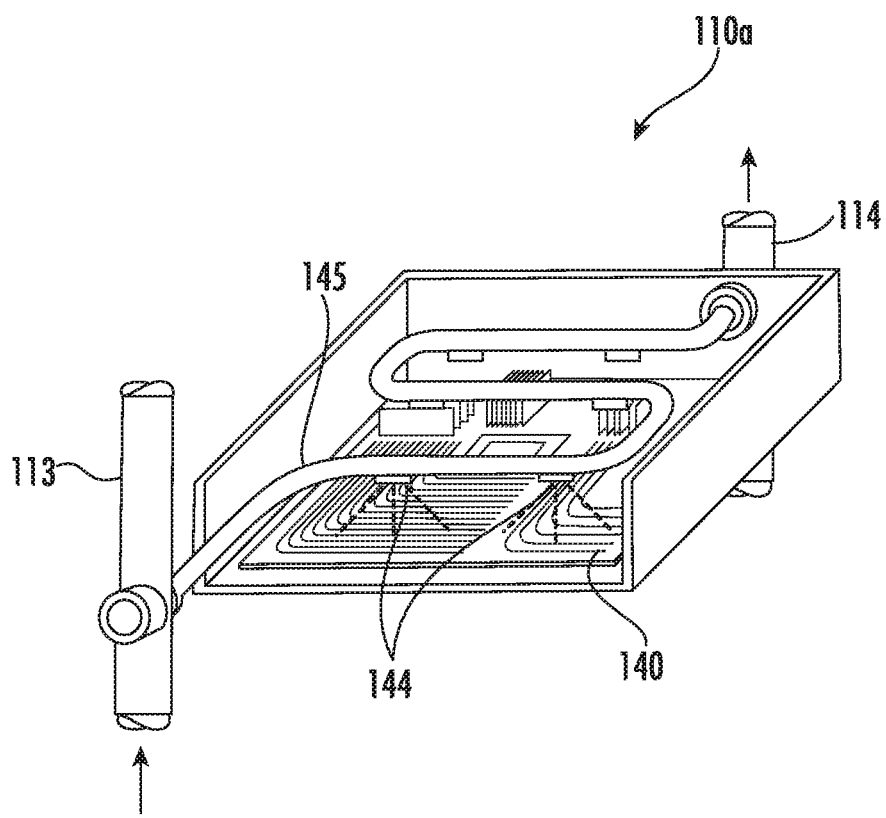
FIG. 5 is a schematic of air flow through a pressure box of a data center.

The pressure boxes 110a-110e house the computer electronics 140 or other equipment as shown in FIG. 5. The air enters the pressure box 110a, for example, via manifold 113 into an air tube 145. A bypass hose 127 is configured to selectively control which pressure boxes of the plurality of pressure boxes 110a-110e are supplied with air via the manifold 113. The air tube 145 may have one or more adjustable nozzles 144 configured to control the air flow. The air exits the pressure box 110a via exhaust pipe 114. The air handler 102/blower 104 pushes cooling air flowing in the inner tube 118 to the pressure box 110a, and moves heated exhaust air towards the outer tube 116.

In operation, the thermal-polarizing membrane 120 reacts from the heat in the airflow and begins exchanging condensed fluid towards the inner tube 118 thereby cooling the innermost side of the thermal-polarizing membrane 120. The innermost side of the thermal-polarizing membrane 120 contacts the inner tube 118 transferring heat from the airflow and transferring cool thermal conductivity from the outer tube 116 to the inner tube 118.

The air temperature of the heated exhaust air recirculated back through the system to the thermal-polarizing pipes 106a and 106b are thermally reduced, starting the cycle again. The electron movement continues to balance into an equilibrium with minor temperature fluctuation and acceptable heat levels on the unit components.

Many modifications and other embodiments of the invention will come to the mind of one skilled in the art having That which is claimed is:

1. A data center cooling system comprising:
    a plurality of conduits configured to recirculate air through a data center;
    an air handler in fluid communication with the plurality of conduits;
    a blower coupled to the air handler;
    a thermal-polarizing pipe coupled to the blower; and
    at least one pressure box coupled to the thermal polarizing pipe, wherein the at least one pressure box is configured to house electronics;
    wherein the thermal-polarizing pipe comprises an inner tube, an outer tube surrounding the inner tube forming an annular cavity between the inner and outer tubes, and a plastic membrane containing a solution within the annular cavity that is configured to transfer heat from the air flowing through the inner tube and towards the outer tube.

2. The data center cooling system of claim 1, wherein the the solution comprises salt and water.

3. The data center cooling system of claim 2, wherein the thermal-polarizing pipe having a temperature controlled coil around the outer tube of the thermal-polarizing pipe.

4. The data center cooling system of claim 3, further comprising a chill box having air conditioning equipment and housing the thermal-polarizing pipe.

5. The data center cooling system of claim 4, wherein the air conditioning equipment is in fluid communication with the temperature controlled coil.

6. The data center cooling system of claim 1, further comprising a nitrogen generator in fluid communication with the air handler and configured to adjust a nitrogen concentration of the air.

7. The data center cooling system of claim 1, wherein the inner tube of the thermal-polarizing pipe having a mixer disposed therein to slow a velocity of the air.

8. The data center cooling system of claim 6, further comprising a storage box downstream of the nitrogen generator and configured to equalize a volume of the air flowing through the plurality of conduits.

9. The data center cooling system of claim 1, further comprising an air ionizer in fluid communication with the air handler.

10. The data center cooling system of claim 1, wherein the at least one pressure box having an air tube passing through the at least one pressure box and configured to disperse the air therein.

11. The data center cooling system of claim 1, further comprising a manifold in fluid communication with the plurality of conduits and configured to supply the air to the at least one pressure box.

12. A data center cooling system comprising:
    a plurality of conduits configured to recirculate air through a data center;
    an air handler in fluid communication with the plurality of conduits;
    a thermal-polarizing pipe coupled to a blower, wherein the blower is configured to supply the air through the thermal-polarizing pipe; and
    at least one pressure box coupled to the thermal-polarizing pipe, wherein the at least one pressure box is configured to house electronics;
    wherein the thermal-polarizing pipe comprises an inner tube, an outer tube surrounding the inner tube and forming an annular cavity between the inner and outer tubes, and a plastic membrane containing a solution within the annular cavity and configured to transfer heat from the air flowing through the inner tube and towards the outer tube.

13. The data center cooling system of claim 12, wherein the thermal-polarizing pipe comprises a thermal-polarizing membrane configured to cool the air flowing through.

14. The data center cooling system of claim 13, wherein the thermal-polarizing pipe having a temperature controlled coil around an exterior surface of the thermal-polarizing pipe.

15. The data center cooling system of claim 14, wherein the inner tube of the thermal-polarizing pipe having a mixer disposed therein to slow a velocity of the air.

16. The data center cooling system of claim 15, further comprising air conditioning equipment in fluid communication with the temperature controlled coil.

17. The data center cooling system of claim 16, wherein the at least one pressure box having an air tube passing through the at least one pressure box and configured to disperse the air therein.

18. The data center cooling system of claim 12, further comprising a nitrogen generator in fluid communication with the air handler and configured to adjust a nitrogen concentration of the air.

19. A method of cooling a data center having a plurality of conduits configured to recirculate air through the data center, an air handler in fluid communication with the plurality of conduits, a blower coupled to the air handler, a thermal-polarizing pipe coupled to the blower, wherein the blower is configured to supply the air through the thermal-polarizing pipe, and at least one pressure box coupled to the thermal-polarizing pipe, wherein the at least one pressure box is configured to house electronics, the method comprising:
    recirculating the air from the at least one pressure box through the thermal-polarizing pipe and back to the at least one pressure box to cool the electronics.

* * * * *